United States Patent
Cheng

(10) Patent No.: US 11,450,134 B2
(45) Date of Patent: Sep. 20, 2022

(54) FINGERPRINT DETECTION ASSEMBLY, DISPLAY PANEL AND ELECTRONIC APPARATUS

(71) Applicant: BEIJING XIAOMI MOBILE SOFTWARE CO., LTD., Beijing (CN)

(72) Inventor: Chihjen Cheng, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/099,703

(22) Filed: Nov. 16, 2020

(65) Prior Publication Data

US 2021/0374377 A1 Dec. 2, 2021

(30) Foreign Application Priority Data

May 26, 2020 (CN) .......................... 202010453928.0

(51) Int. Cl.
  *G06F 3/044* (2006.01)
  *G06V 40/13* (2022.01)
  *H01L 27/32* (2006.01)

(52) U.S. Cl.
  CPC ........ *G06V 40/1306* (2022.01); *G06F 3/0443* (2019.05); *H01L 27/323* (2013.01); *H01L 27/326* (2013.01); *H01L 27/3276* (2013.01)

(58) Field of Classification Search
  CPC .............. G06K 9/0002; G06K 9/00013; H01L 27/323; H01L 27/326; H01L 27/3276; H04N 5/35572; H04N 5/3745; G06F 3/04164; G06F 3/0443; G06V 40/1306
  USPC ........................................................ 382/124
  See application file for complete search history.

(56) References Cited

U.S. PATENT DOCUMENTS

| 2016/0006969 A1 | 1/2016 | Matsumoto |
| 2017/0064233 A1 | 3/2017 | Matsumoto |
| 2017/0097702 A1* | 4/2017 | Chang .................. G06K 9/0002 |
| 2017/0223317 A1 | 8/2017 | Matsumoto |
| 2018/0025203 A1* | 1/2018 | Lee ........................ G06F 3/0443 382/124 |
| 2018/0048872 A1 | 2/2018 | Matsumoto |
| 2018/0070039 A1* | 3/2018 | Ling .................. H04N 5/35572 |
| 2018/0260056 A1 | 9/2018 | Chang et al. |
| 2018/0352200 A1 | 12/2018 | Matsumoto |
| 2019/0004663 A1 | 1/2019 | Li et al. |

(Continued)

FOREIGN PATENT DOCUMENTS

EP 2963918 A1 1/2016

OTHER PUBLICATIONS

European Search Report in the European application No. 20208558.5, dated May 11, 2021.

*Primary Examiner* — Abdul-Samad A Adediran
(74) *Attorney, Agent, or Firm* — Syncoda LLC; Feng Ma

(57) ABSTRACT

A fingerprint detection assembly includes a plurality of fingerprint pixel circuits and a signal reading device. The plurality of fingerprint pixel circuits are arranged in multiple rows and multiple columns, each column of the fingerprint pixel circuits are divided into a plurality of column fingerprint pixel units along a longitudinal direction. Each of the plurality of the column fingerprint pixel units is connected to the signal reading device through a respective data line. The signal reading device is configured to read the fingerprint signals which are collected by the fingerprint pixel circuits.

12 Claims, 11 Drawing Sheets

(56) References Cited

U.S. PATENT DOCUMENTS

2019/0180075 A1* 6/2019 Kim .................... H04N 5/3745
2019/0377446 A1* 12/2019 Lin .................... G06K 9/00013
2021/0012078 A1* 1/2021 Chang ................ G06F 3/04164

* cited by examiner 130 114

FINGERPRINT DETECTION ASSEMBLY, DISPLAY PANEL AND ELECTRONIC APPARATUS

CROSS-REFERENCE TO RELATED APPLICATIONS

This application claims priority to Chinese patent application No. 202010453928.0 filed on May 26, 2020, the disclosure of which is hereby incorporated by reference in its entirety.

BACKGROUND

With the development of the full-screen technologies, under-screen fingerprint detection has become a main development trend for fingerprint detection. The under-screen fingerprint refers to a technology in which a fingerprint detection assembly of an electronic apparatus is disposed under a display module.

SUMMARY

The disclosure relates generally to the technical field of electronic devices, and more specifically to a fingerprint detection assembly, a display panel and an electronic apparatus.

According to an aspect of the disclosure, there is provided a fingerprint detection assembly. The fingerprint detection assembly includes a plurality of fingerprint pixel circuits and a signal reading device.

The plurality of fingerprint pixel circuits are arranged in multiple rows and multiple columns, each column of fingerprint pixel circuits are divided into a plurality of column fingerprint pixel units along a longitudinal direction, each of the plurality of the column fingerprint pixel units is connected to the signal reading device through a respective data line, and the signal reading device is configured to read fingerprint signals which are collected by the fingerprint pixel circuits.

According to another aspect of the disclosure, there is provided a display panel. The display panel includes the fingerprint detection assembly mentioned above.

According to another aspect of the disclosure, there is provided an electronic apparatus, and the electronic apparatus includes the display panel mentioned above.

BRIEF DESCRIPTION OF THE DRAWINGS

The accompanying drawings referred to in the specification are a part of this disclosure, and provide illustrative embodiments consistent with the disclosure and, together with the detailed description, serve to illustrate some embodiments of the disclosure.

DETAILED DESCRIPTION

Figure 1:
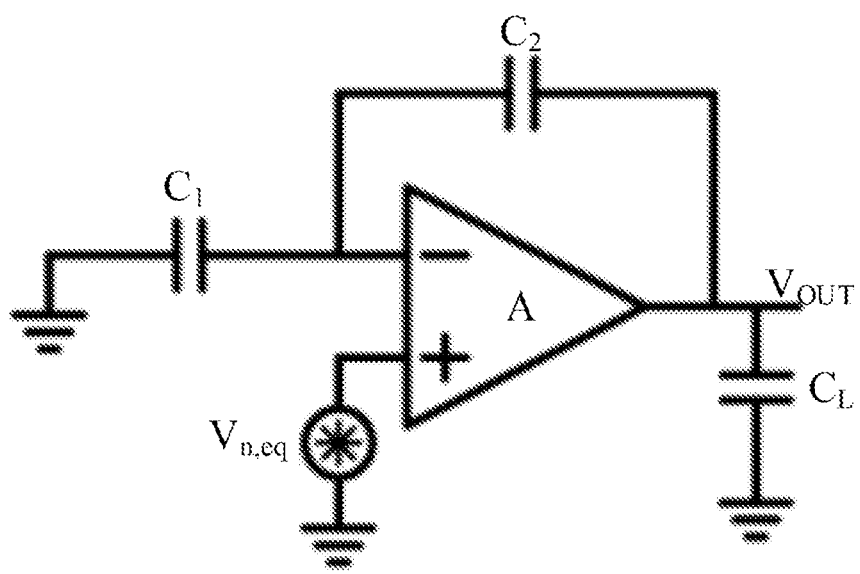
FIG. 1 is an equivalent circuit diagram of connection between a column of fingerprint pixel circuits and a signal reading device.

Exemplary embodiments (examples of which are illustrated in the accompanying drawings) are elaborated below. The following description refers to the accompanying drawings, in which identical or similar elements in two drawings are denoted by identical reference numerals unless indicated otherwise. The exemplary implementation modes may take on multiple forms, and should not be taken as being limited to examples illustrated herein. Instead, by providing such implementation modes, embodiments herein may become more comprehensive and complete, and comprehensive concept of the exemplary implementation modes may be delivered to those skilled in the art. Implementations set forth in the following exemplary embodiments do not represent all implementations in accordance with the subject disclosure. Rather, they are merely examples of the apparatus and method in accordance with certain aspects herein as recited in the accompanying claims.

The terms used in the disclosure are for the purpose of describing the specific embodiments only and are not intended to limit the disclosure. Unless otherwise defined, technical terms or scientific terms used in the disclosure should be understood in the ordinary meaning of those of ordinary skill in the art to which the disclosure pertains. The words "first", "second" and similar terms used in the specification and claims of the disclosure are not intended to indicate any order, quantity or importance, but only to distinguish different components. Similarly, similar words such as "one" or "a/an" do not indicate any quantity limitation, but the existence of at least one. Unless otherwise specified, similar words "comprise" or "include" and the like mean that elements or objects preceding "comprise" or "include" encompass listed elements or objects following "comprise" or "include" and their equivalents, and do not exclude other elements or objects. Words such as "connect" or "connected" are not limited to physical or mechanical connections, and may include electrical connections, whether direct or indirect.

"A/an", "the" and "this" in a singular form in the specification of the disclosure and the appended claims are also intended to include a plural form, unless other meanings are clearly denoted throughout the disclosure. It should also be understood that the term "and/or" as used herein refers to and includes any or all possible combinations of one or more associated listed items.

At present, the full-screen fingerprint detection technology of the electronic apparatus is favored by users, and the area of the fingerprint detection assembly may need to be enlarged. However, this will make the load of each column of the fingerprint pixel circuits in the fingerprint detection assembly larger and thus generate larger noise, which is not favorable for the fingerprint detection assembly to obtain accurate fingerprint signals, and is not favorable for increasing the size of the fingerprint detection assembly.

In some embodiments, the fingerprint detection assembly is an optical fingerprint detection assembly. The fingerprint detection assembly includes a plurality of fingerprint pixel circuits, a signal driving device and a signal reading device. The plurality of fingerprint pixel circuits are arranged in multiple rows and multiple columns, that is, a fingerprint pixel circuit array is formed. The signal driving device is configured to sequentially drive gate switches in each row of fingerprint pixel circuits to be switched on. The signal reading device is configured to read the fingerprint signal collected by the fingerprint pixel circuits, which are driven and switched on by the signal driving device, in each column of fingerprint pixel circuits.

With the development of the full-screen fingerprint detection technologies, the size of the fingerprint detection assembly is getting larger and larger. In other words, the area of the fingerprint pixel circuit array is getting larger and larger. This makes each column of fingerprint pixel circuits have a larger number of fingerprint pixel circuits, and each column of fingerprint pixel circuits have larger load and equivalent capacitance $C_1$, which is more likely to generate noise. The following explains in conjunction with FIG. 1 and a formula.

FIG. 1 is an equivalent circuit diagram of connection between a column of fingerprint pixel circuits and a signal reading device. $C_1$ represents equivalent capacitance of a column of fingerprint pixel circuits; $C_2$ represents feedback capacitance of an operational amplifier A in the signal reading device; $V_{n,eq}$ represents equivalent noise of the operational amplifier A; and $V_{OUT}$ represents a signal output end of the signal reading device. According to the following formula, the larger the $C_1$, the larger the $V_{OUT,noise}$ (noise which is output by the signal reading device), which is not favorable for the signal reading device to read accurate fingerprint signals, is not favorable for manufacturing a fingerprint detection assembly with a larger size, and is not favorable for realizing the full-screen fingerprint detection technology.

$$V_{OUT,noise} = \frac{C_1 + C_2}{C_2} V_{n,eq}$$

Based on the above defects, the embodiments of the disclosure provide a fingerprint detection assembly, a display panel and an electronic apparatus which are described in detail below with reference to the accompanying drawings.

In the embodiments of the disclosure, the electronic apparatus includes, but is not limited to: a mobile phone, a tablet computer, an iPad, a digital broadcasting terminal, a messaging devices, a game console, a medical device, a fitness device, a personal digital assistant, a smart wearable device, a smart television, a sweeping robot, a smart speakers, etc.

In some embodiments, the electronic apparatus includes a display panel. The number of the display panel is at least one, and the display panel may further include a folding screen.

Figure 2:
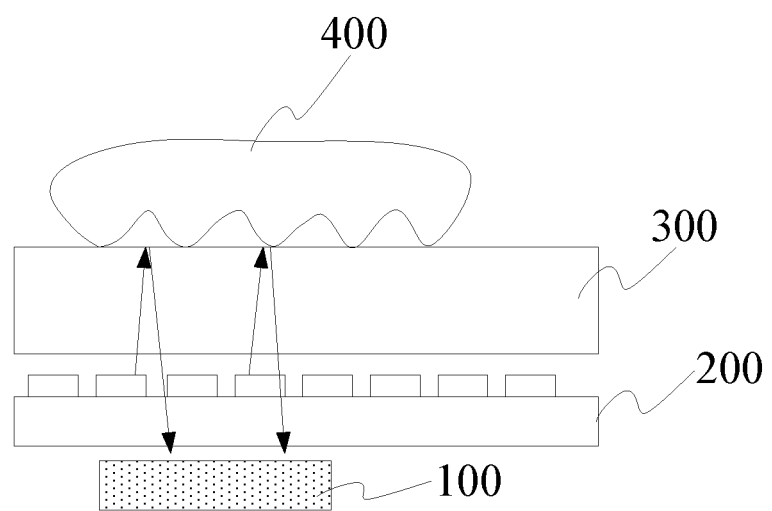
FIG. 2 is a partial cross-sectional diagram of a display panel according to some embodiments of the disclosure.

FIG. 2 is a partial cross-sectional diagram of a display panel according to some embodiments of the disclosure. Referring to FIG. 2, the display panel includes a fingerprint detection assembly 100. Exemplarily, the fingerprint detection assembly 100 includes an optical fingerprint detection assembly.

In some embodiments, still referring to FIG. 2, the display panel further includes a display module 200, and the display module 200 includes a display surface. The fingerprint detection assembly 100 is disposed on the side of the display module 200 facing away from the display surface, and the orthographic projection of the fingerprint detection assembly 100 on the display surface entirely covers the display surface. In other words, the entire display panel may be used as a fingerprint detection region to realize the full-screen fingerprint detection technology. In some other embodiments, the orthographic projection of the fingerprint detection assembly 100 on the display surface covers a part of the display surface, so that a part of the display panel serves as a fingerprint detection region.

Exemplarily, the display module 200 includes an Organic Light-Emitting Diode (OLED) display layer.

In some embodiments, still referring to FIG. 2, the display panel further includes a covering layer 300 which faces the display surface, to protect the display module 200. When a finger 400 presses the covering layer 300, the display module 200 may emit light to the finger 400. The light is reflected by the ridges and valleys of the fingerprints of the finger 400 and is then received by the fingerprint detection assembly 100. The fingerprints are detected based on the light received by the fingerprint detection assembly 100.

Figure 3:
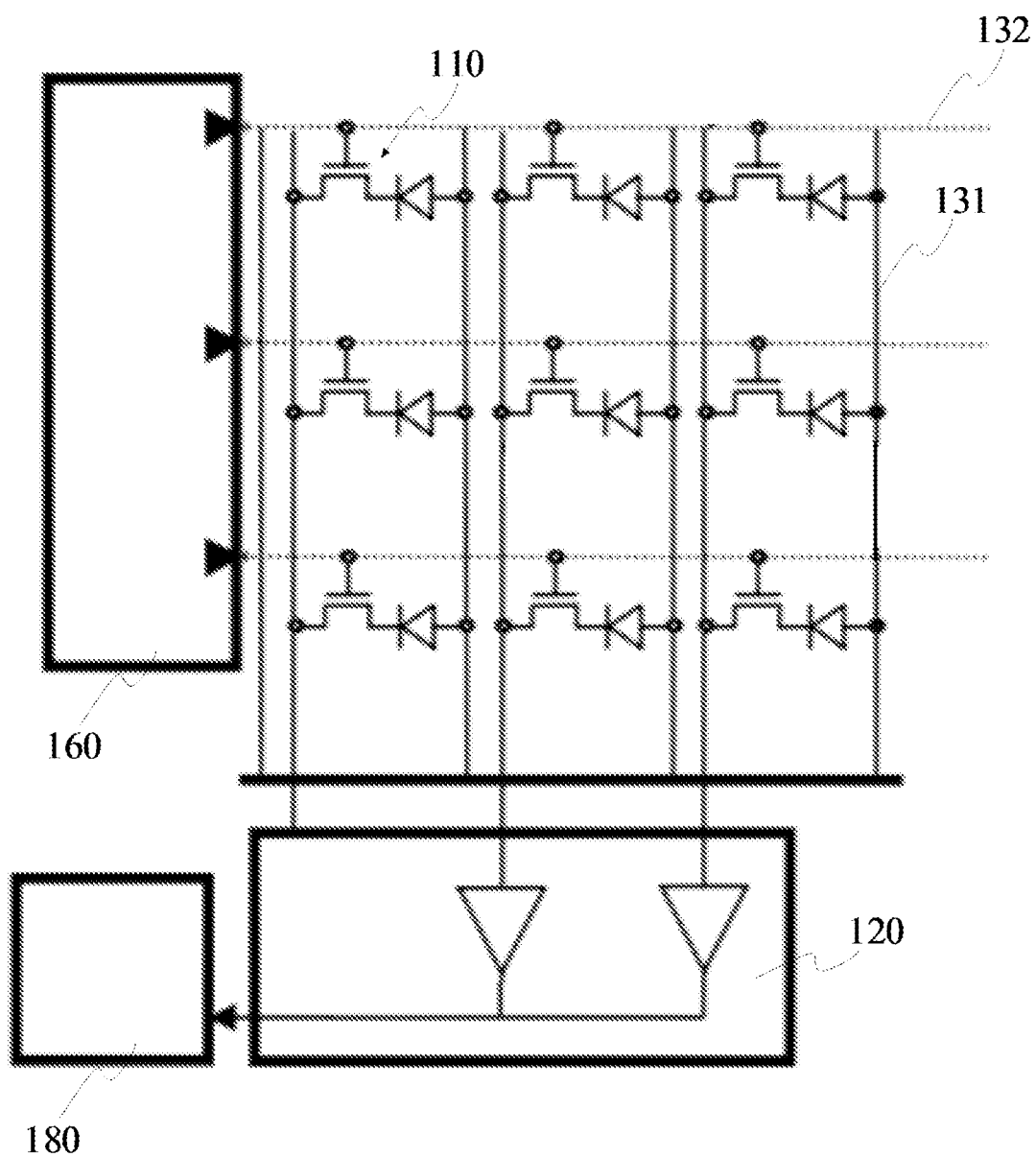
FIG. 3 is a partial schematic structural diagram of a fingerprint detection assembly according to some embodiments of the disclosure.
Figure 4:
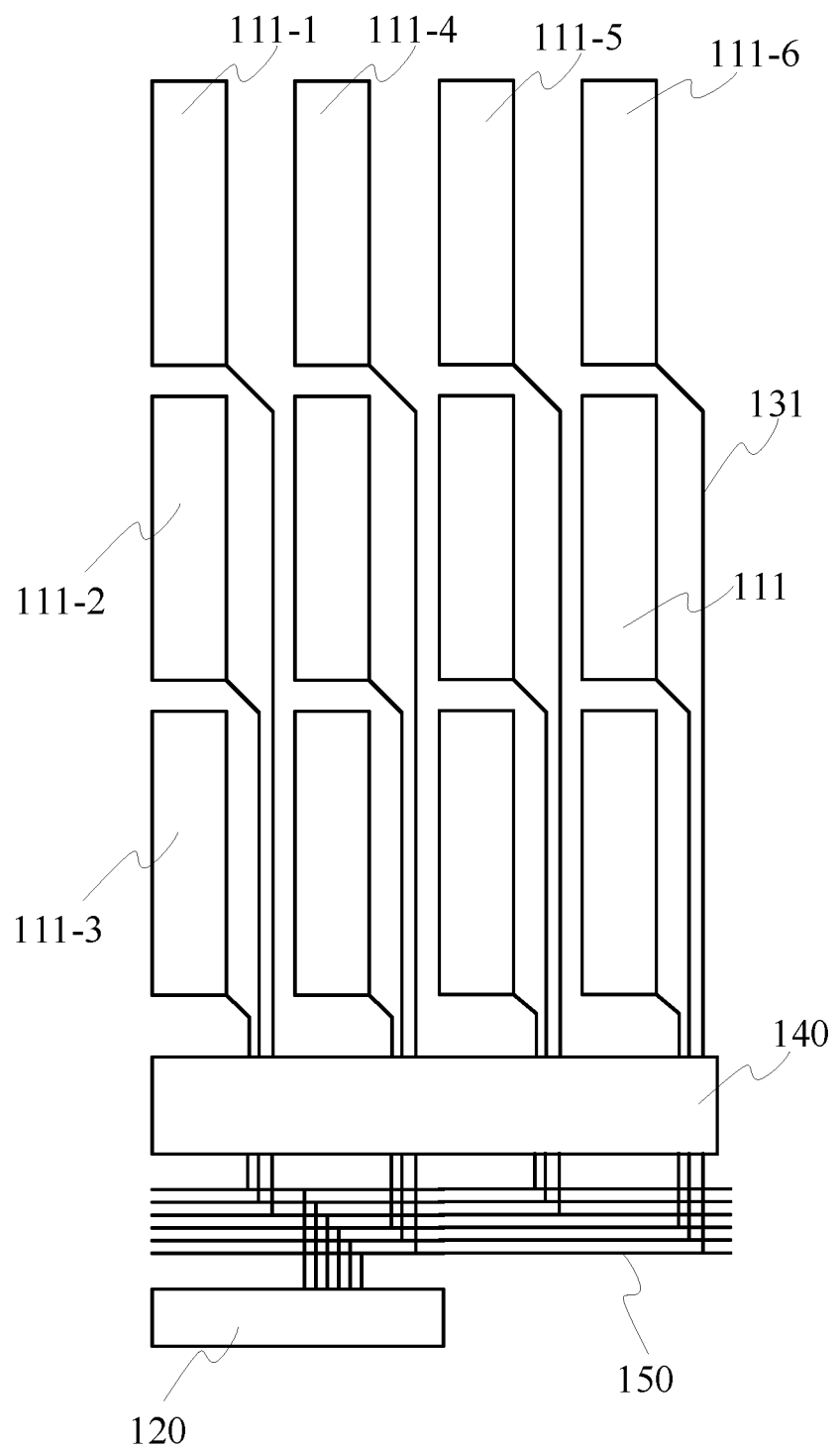
FIG. 4 is a partial schematic structural diagram of a fingerprint detection assembly according to some embodiments of the disclosure.
Figure 5:
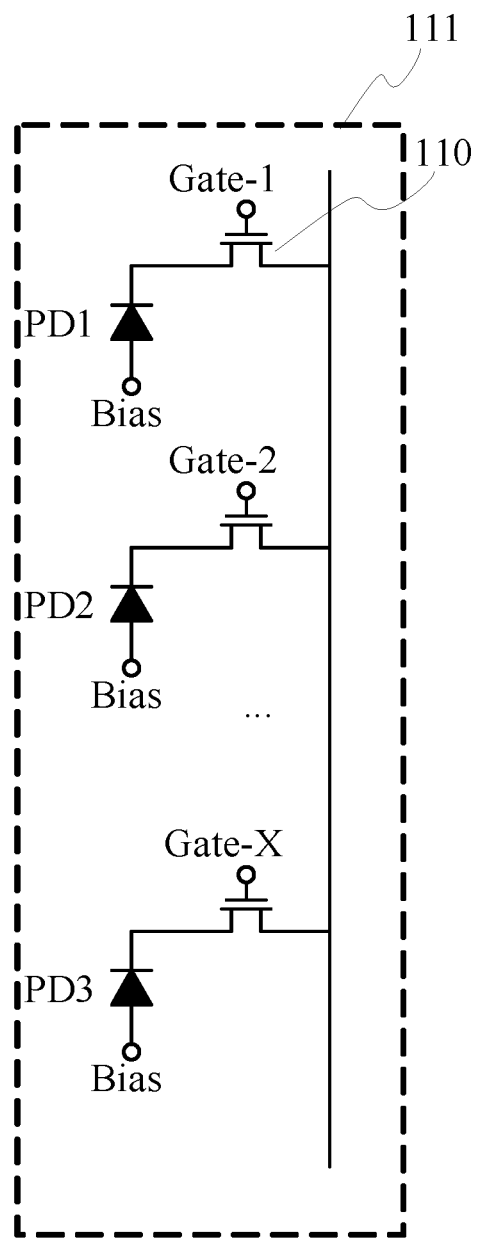
FIG. 5 is a schematic circuit diagram of column fingerprint pixel units in FIG. 4.

FIG. 3 is a partial schematic structural diagram of a fingerprint detection assembly 100 according to some embodiments of the disclosure. FIG. 4 is a partial schematic structural diagram of a fingerprint detection assembly 100 according to some embodiments of the disclosure. FIG. 5 is a schematic circuit diagram of column fingerprint pixel units in FIG. 4. Referring to FIG. 3 to FIG. 5, the fingerprint detection assembly 100 provided in some embodiments of the disclosure includes a plurality of fingerprint pixel circuits 110 and a signal reading device 120.

The plurality of fingerprint pixel circuits 110 are arranged in multiple rows and multiple columns, that is, a fingerprint pixel circuit array is formed. Each column of fingerprint pixel circuits 110 are divided into a plurality of column fingerprint pixel units 111 along a longitudinal direction. Each of the plurality of column fingerprint pixel units 111 is connected to the signal reading device 120 through a respective data line 131. The signal reading device 120 is configured to read the fingerprint signals which are collected by the fingerprint pixel circuits 110.

It should be noted that the "longitudinal direction" involved in the disclosure refers to a direction which is parallel to each column of fingerprint pixel circuits 110. Each of the column fingerprint pixel units 111 may include a plurality of fingerprint pixel circuits 110.

In order to more clearly understand the relationship among each column of fingerprint pixel circuits 110, the column fingerprint pixel units 111 and the signal reading device 120, exemplarily, referring to FIG. 4, each column of fingerprint pixel circuits 110 include three column fingerprint pixel units 111 sequentially disposed along a longitudinal direction. Taking the first column of fingerprint pixel circuits 110 as an example, the first column of fingerprint pixel circuits 110 includes a column fingerprint pixel unit 111-1, a column fingerprint pixel unit 111-2 and a column fingerprint pixel unit 111-3 which are sequentially disposed along a longitudinal direction. Exemplarily, referring to FIG. 5, each of the column fingerprint pixel units 111 includes a plurality of fingerprint pixel circuits 110, such as x fingerprint pixel circuits 110 which are sequentially a first fingerprint pixel circuit, a second fingerprint pixel circuit, . . . , an xth fingerprint pixel circuit along a longitudinal direction.

In some embodiments, the fingerprint pixel circuit includes a passive fingerprint pixel circuit. The passive fingerprint pixel circuit is usually disposed on a glass substrate, which is beneficial to reducing the cost. Taking the first fingerprint pixel circuit as an example, the first fingerprint pixel circuit includes a gate switch Gate-1 and a photosensitive diode PD1 which are connected. When the gate switch Gate-1 is switched on, the photosensitive diode PD1 outputs the fingerprint signal converted from an optical signal to the signal reading device 120 through a data line 131.

Based on the above, in the fingerprint detection assembly 100 provided by the embodiments of the disclosure, since each column of fingerprint pixel circuits 110 are divided into a plurality of column fingerprint pixel units 111, each of the plurality of column fingerprint pixel units 111 is connected to the signal reading device 120 through a respective data line 131, and it is not that the entire column of fingerprint pixel circuits 110 are connected to the signal reading device 120 through a data line, when the signal reading device 120 reads fingerprint signals, the load and equivalent capacitance of the fingerprint pixel circuit 110 connected to the signal reading device 120 are reduced relative to the entire column of fingerprint pixel circuits, thus reducing the noise which is output by the signal reading device 120, thereby being favorable for the signal reading device 120 to accurately read the fingerprint signals and also favorable for increasing the size of the fingerprint detection assembly 100 so as to realize the full-screen fingerprint detection technology.

In some embodiments, still referring to FIG. 4, the fingerprint detection assembly 100 further includes a switch device 140, and the switch device 140 is connected between the signal reading device 120 and the column fingerprint pixel units 111. Thus, the switch device 140 may be controlled to switch on or switch off the column fingerprint pixel units 111 and the signal reading device 120, so as to control whether the signal reading device 120 reads the fingerprint signals which are collected by the fingerprint pixel circuits 110 in the column fingerprint pixel units 111.

Figure 6:
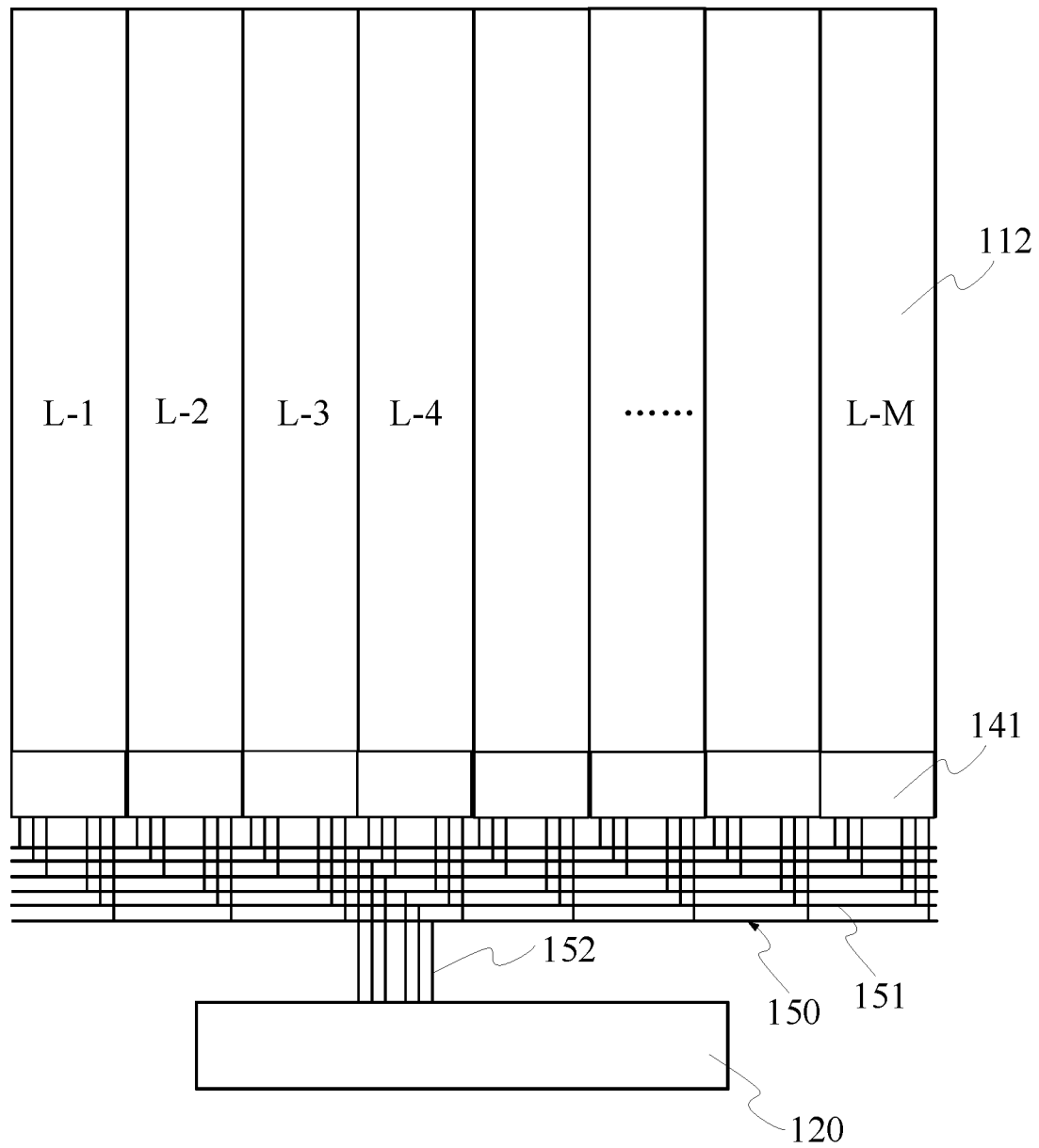
FIG. 6 is a partial schematic structural diagram of a fingerprint detection assembly according to some embodiments of the disclosure.
Figure 7:
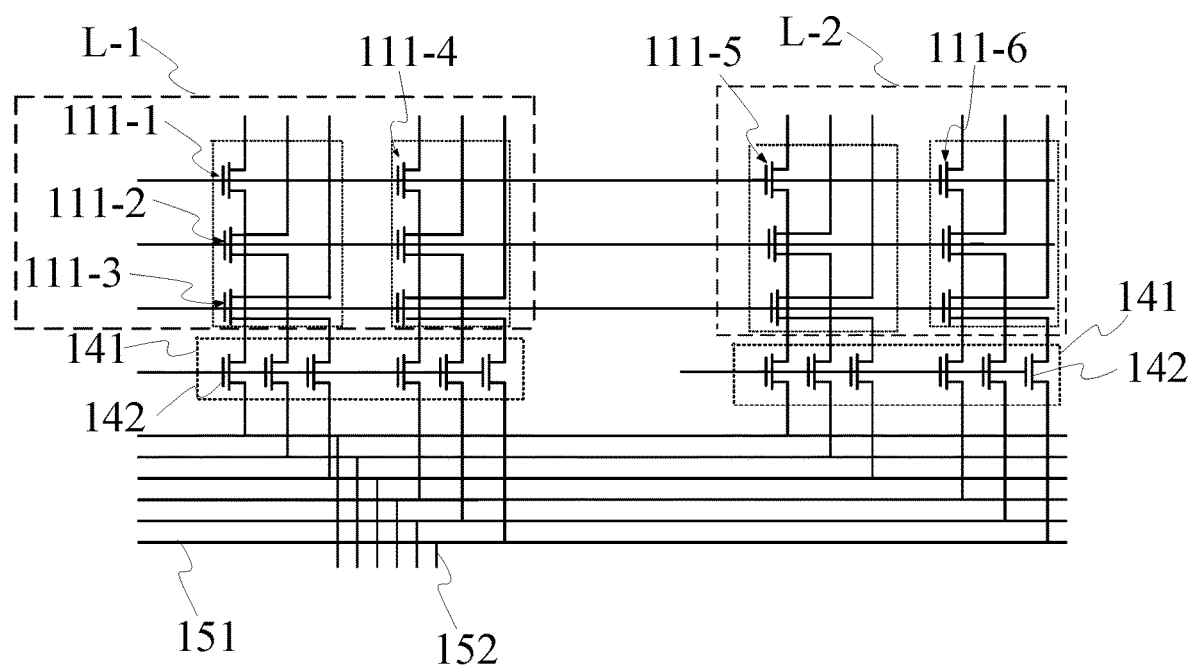
FIG. 7 is a schematic diagram of connection between two groups of column fingerprint pixel regions and switch units in FIG. 6.

FIG. 6 is a partial schematic structural diagram of a fingerprint detection assembly 100 according to some embodiments of the disclosure. FIG. 7 is a schematic diagram of connection between two groups of column fingerprint pixel regions 112 and switch units 141 in FIG. 6. In some embodiments, referring to FIG. 6 and FIG. 7, multiple columns of fingerprint pixel circuits 110 are divided into multiple groups of column fingerprint pixel regions 112 along a longitudinal direction, and each group of column fingerprint pixel region 112 includes at least two columns of fingerprint pixel circuits 110. The switch device 140 includes a plurality of switch units 141, and each of the switch units 141 is connected between one group of column fingerprint pixel region 112 and the signal reading device 120. In this way, by controlling at least one switch unit 141 to be switched on, the signal reading device 120 may read the fingerprint signal collected by the fingerprint pixel circuits 110 in the column fingerprint pixel region 112, and by further controlling other switch units 141 to be switched off to disconnect other column fingerprint pixel regions 112 and the signal reading device 120, partitioned control of the work of the fingerprint pixel circuits 110 is realized, thereby being favorable for reducing the power consumption and increasing the utilization ratio of the signal reading device 120. Exemplarily, which switch units 141 are switched on may be selected based on the area of a finger pressing region, so as to realize partitioned detection of fingerprints.

Still referring to FIG. 6, the number of the column fingerprint pixel regions 112 is M, and from left to right, the column fingerprint pixel regions are sequentially a column fingerprint pixel region L-1, a column fingerprint pixel region L-2, a column fingerprint pixel region L-3, a column fingerprint pixel region L-4, . . . , and a column fingerprint pixel region L-M. Exemplarily, each group of column fingerprint pixel region 112 includes two columns of fingerprint pixel circuits 110. For example, referring to FIG. 4 and FIG. 7, the column fingerprint pixel region L-1 includes a column fingerprint pixel unit 111-1 and a column fingerprint pixel unit 111-4, and other column fingerprint pixel units 111 belonging to the same column as these two columns. The column fingerprint pixel region L-2 includes a column fingerprint pixel unit 111-5 and a column fingerprint pixel unit 111-6, and other column fingerprint pixel units 111 belonging to the same column as these two columns.

Exemplarily, referring to FIG. 7, each of the switch units 141 includes a plurality of switches 142, and each of the switches 142 is connected to a column fingerprint pixel unit 111. Exemplarily, referring to FIG. 7, each group of column fingerprint pixel region 112 includes two columns of fingerprint pixel circuits 110, each column of fingerprint pixel circuits 110 include three column fingerprint pixel units 111, each of the switch units 141 includes six switches 142, and each of the switches 142 is connected to a column fingerprint pixel unit 111. Taking the column fingerprint pixel region L-1 as an example, the column fingerprint pixel region L-1 includes two columns of fingerprint pixel circuits, wherein the fingerprint pixel circuit 110 of the left column includes a column fingerprint pixel unit 111-1, a column fingerprint pixel unit 111-2 and a column fingerprint pixel unit 111-3.

Based on the above, since each of the plurality of column fingerprint pixel units 111 is connected to the signal reading device 120 through a respective data line 131, the signal reading device 120 needs to be provided with a plurality of interfaces and a plurality of wires, which is not favorable for reducing the cost and increasing the integration level of the fingerprint detection assembly 100. In some embodiments, referring to FIG. 6 and FIG. 7, at least two switch units 141 are connected to the signal reading device 120 through the same first common wires 150, thereby being favorable for reducing the number of the interfaces of the signal reading device 120 and the number of the arranged wires, so as to reduce the cost and increase the integration level of the fingerprint detection assembly 100.

Exemplarily, referring to FIG. 6 and FIG. 7, the first common wires 150 include a plurality of first horizontal wires 151 and a plurality of first longitudinal wires 152. Each group of column fingerprint pixel region 112 is connected to a switch unit 141, each group of column fingerprint pixel region 112 includes at least two columns of fingerprint pixel circuits 110. All column fingerprint pixel units 111 in each group of column fingerprint pixel region 112 are connected to the plurality of first horizontal wires 151 through a switch unit 141. Each of the first horizontal wires 151 is connected to the signal reading device 120 through a first longitudinal wire 152, and at least two switch units 141 are connected to the same first horizontal wires 151. Such a manner is favorable for reducing the number of the first horizontal wires 151, so as to increase the integration level of the fingerprint detection assembly 100.

Exemplarily, still referring to FIG. 6 and FIG. 7, the number of the first horizontal wires 151 is six, and the number of the first longitudinal wires 152 is six. Each group of column fingerprint pixel region 112 includes two columns of fingerprint pixel circuits 110, and each column of fingerprint pixel circuits 110 include three column fingerprint pixel units 111. In each group of column fingerprint pixel region 112, six column fingerprint pixel units 111 are connected to six first horizontal wires 151 respectively through a switch unit 141, and six first horizontal wires 151 are connected to six first longitudinal wires 152 respectively. For example, both the column fingerprint pixel region L-1 and the column fingerprint pixel region L-2 are connected to the same six first horizontal wires 151. Thus, multiple groups of column fingerprint pixel regions 112 share six first horizontal wires 151 and six first longitudinal wires 152, which is favorable for reducing the number of the wires and increasing the integration level of the fingerprint detection assembly 100.

Figure 8:
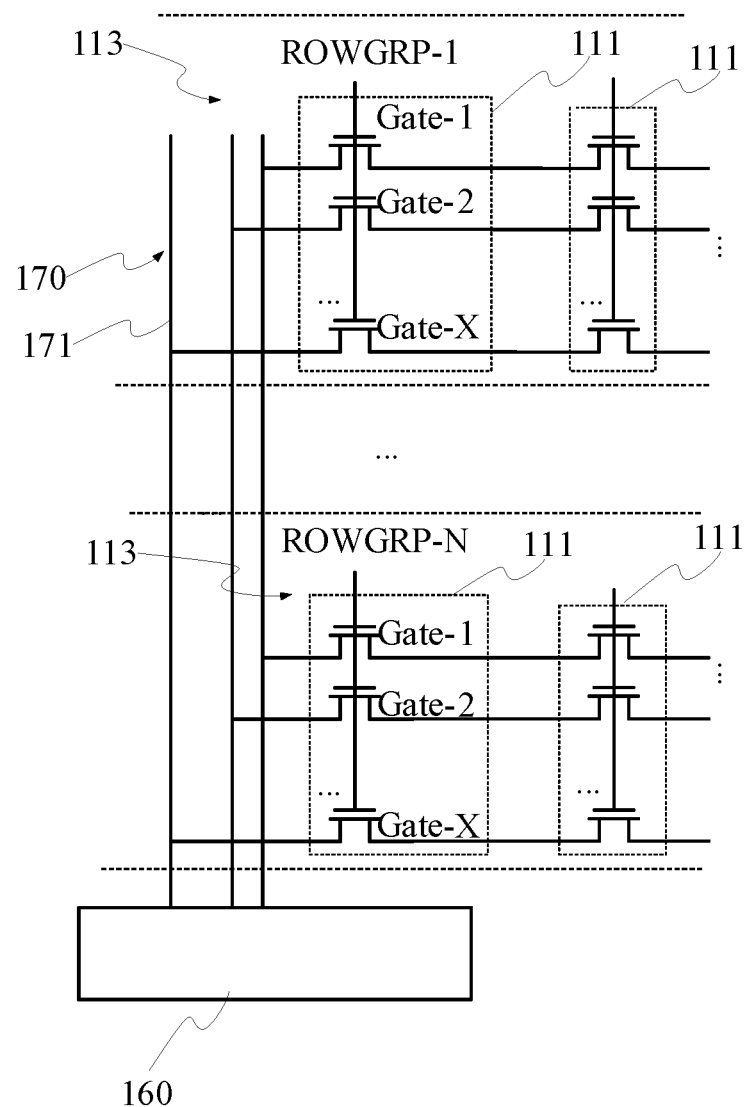
FIG. 8 is a partial schematic structural diagram of a fingerprint detection assembly according to some embodiments of the disclosure.

FIG. 8 is a partial schematic structural diagram of a fingerprint detection assembly 100 according to some embodiments of the disclosure. In some embodiments, referring to FIG. 3 and FIG. 8, the fingerprint detection assembly 100 further includes: a signal driving device 160 which is connected to each row of fingerprint pixel circuits 110 and configured to send a driving signal to each row of fingerprint pixel circuits 110, so as to drive the gate switch in each row of fingerprint pixel circuits 110 to be switched on. The multiple rows of fingerprint pixel circuits 110 are divided into multiple groups of row fingerprint pixel regions 113 along a horizontal direction. Each group of row fingerprint pixel region 113 includes a plurality of column fingerprint pixel units 111, and the plurality of column fingerprint pixel units 111 are respectively located in different columns. In other words, each row fingerprint pixel region 113 includes a plurality of column fingerprint pixel units 111 disposed along a horizontal direction, and in each row fingerprint pixel region 113, each column has only one column fingerprint pixel unit 111. It should be noted that the "horizontal direction" refers to a direction which is parallel to each row of fingerprint pixel circuits 110.

Exemplarily, still referring to FIG. 8, the number of the row fingerprint pixel regions 113 is N, and from top to bottom, the row fingerprint pixel regions 113 are sequentially a row fingerprint pixel region ROWGRP-1, a row fingerprint pixel region ROWGRP-2, . . . , and a row fingerprint pixel region ROWGRP-N. Taking the row fingerprint pixel region ROWGRP-1 as an example, the row fingerprint pixel region ROWGRP-1 includes a plurality of column fingerprint pixel units 111. In this way, any group of row fingerprint pixel region 113 is driven by the signal driving device 160, and any group of column fingerprint pixel region 112 is gated by the switch device 140, so as to enable the signal reading device 120 to read the fingerprint signals of the fingerprint pixel circuits 110 in the junction regions of the row fingerprint pixel regions 113 and the column fingerprint pixel regions 112, thereby realizing partitioned detection of fingerprints, which is favorable for reducing the power consumption and increasing the utilization ratio of the signal reading device 120.

Exemplarily, the number of the column fingerprint pixel regions 112 is M, and the number of the row fingerprint pixel regions 113 is N. Thus, the signal driving device 160 and the switch device 140 cooperate to control any one of the M×N regions to output fingerprint signals, so as to realize partitioned detection of fingerprints.

In some embodiments, at least two groups of row fingerprint pixel regions 113 are connected to the signal driving device 160 through the same second common wires 170, thereby being favorable for reducing the number of the arranged wires and the number of the interfaces of the signal driving device 160, so as to reduce the cost of the fingerprint detection assembly 100 and increase the integration level of the fingerprint detection assembly 100.

Exemplarily, the second common wires 170 include a plurality of second longitudinal wires 171, and the fingerprint pixel circuits 110 in at least two groups of row fingerprint pixel regions 113 are connected to the same second longitudinal wires 171.

Exemplarily, still referring to FIG. 8, each group of row fingerprint pixel region 113 includes x rows of fingerprint pixel circuits 110, the number of the second longitudinal wires 171 is x, and each row of fingerprint pixel circuits 110 in each group of row fingerprint pixel region 113 are connected to one second longitudinal wire 171. Thus, multiple groups of row fingerprint pixel regions 113 share x second longitudinal wires 171.

Figure 9:
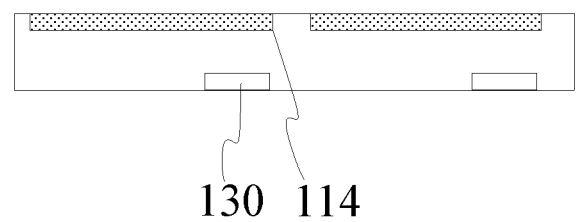
FIG. 9 is a partial cross-sectional diagram of a fingerprint detection assembly according to some embodiments of the disclosure.
Figure 10:
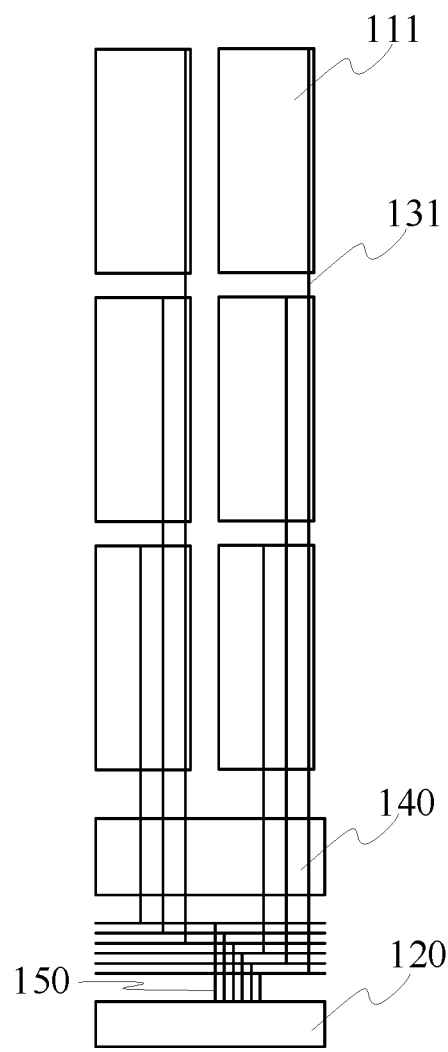
FIG. 10 is a partial schematic structural diagram of a fingerprint detection assembly according to some embodiments of the disclosure.

FIG. 9 is a partial cross-sectional diagram of a fingerprint detection assembly 100 according to some embodiments of the disclosure. FIG. 10 is a partial schematic structural diagram of a fingerprint detection assembly 100 according to some embodiments of the disclosure. In some embodiments, referring to FIG. 3, FIG. 9 and FIG. 10, the fingerprint pixel circuit 110 includes fingerprint sensing units 114 and wires 130 connected in the fingerprint pixel circuits 110. The fingerprint sensing units 114 are disposed at a layer that is different from a layer at which the wires 130 are disposed, and the wires 130 include data lines 131. The data lines 131 are disposed along a longitudinal direction and are connected to the signal reading device 120. It should be noted that referring to FIG. 3, the wires 130 connected in the fingerprint pixel circuits 110 further include gatelines 132 which are arranged along a horizontal direction and connected to the signal driving device 160. In this way, by disposing the wires 130 and the fingerprint sensing units 114 separately at different layers, the interference of the wires 130 to the fingerprint signals is reduced, and the wires 130 give way to the fingerprint sensing units 114 to avoid the occurrence of dead zones of the fingerprint detection assembly 100 due to a large number of wires 130, thereby being favorable for increasing the sizes of the fingerprint sensing units 114 on the premise of ensuring the resolution, further increasing the intensity of the fingerprint signals collected by the fingerprint pixel circuits 110, and being favorable for accurately detecting fingerprints. Exemplarily, the fingerprint sensing unit 114 includes a photosensitive diode.

Referring to FIG. 10, each of the column fingerprint pixel units 111 is connected to the switch device 140 through a data line 131. Then, in the same column of fingerprint pixel circuits 110, the lengths of the data lines 131 corresponding to the plurality of column fingerprint pixel units 111 are unequal, and the number of the data lines 131 corresponding to each of the column fingerprint pixel units 111 is unequal. In this way, the environment of each of the column fingerprint pixel units 111 is inconsistent, and the generated equivalent capacitance and noise are different, so that the error of the driving signal received by each of the fingerprint pixel circuits 110 or the error of the fingerprint signal output by each of the fingerprint pixel circuits 110 is different, which is not favorable for subsequent correction and thus is not favorable for accurate fingerprint detection.

Figure 11:
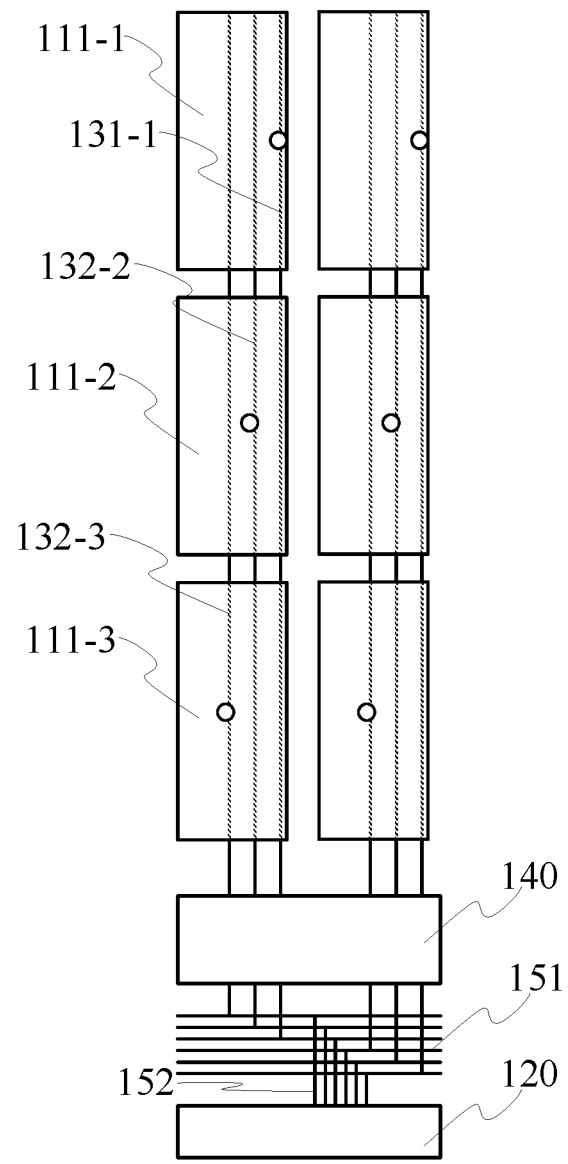
FIG. 11 is a partial schematic structural diagram of a fingerprint detection assembly according to some embodiments of the disclosure.

FIG. 11 is a partial schematic structural diagram of a fingerprint detection assembly 100 according to some embodiments of the disclosure. In some embodiments, referring to FIG. 11, the numbers of the wires 130 corresponding to different column fingerprint pixel units 111 are the same, and the lengths of the wires 130 corresponding to different column fingerprint pixel units 111 are the same. In this way, the environment where each of the column fingerprint pixel units 111 is located is consistent, which enables the error of the fingerprint signal collected by each of the fingerprint pixel circuits 110 to be equal, thereby facilitating subsequent correction and being favorable for accurate fingerprint detection.

Exemplarily, still referring to FIG. 11, taking the left column of fingerprint pixel circuits 110 as an example, it is sequentially divided into a column fingerprint pixel unit 111-1, a column fingerprint pixel unit 111-2 and a column fingerprint pixel unit 111-3 from top to bottom. In FIG. 11, the data line 131 with a circle is a data line 131 connected to the column fingerprint pixel unit 111, and other data lines 131 are extended data lines. Specifically, the column fingerprint pixel unit 111-1, the column fingerprint pixel unit 111-2 and the column fingerprint pixel unit 111-3 are connected to the switch device 140 respectively through a first data line 131-1, a second data line 131-2 and a third data line 131-3. The third data line 131-3 extends to the column fingerprint pixel unit 111-1 and the column fingerprint pixel unit 111-2, and the second data line 131-2 extends to the column fingerprint pixel unit 111-1. Thus, the column fingerprint pixel unit 111-1, the column fingerprint pixel unit 111-2 and the column fingerprint pixel unit 111-3 simultaneously correspond to the first data line 131-1, the second data line 131-2 and the third data line 131-3, and the first data line 131-1, second data line 131-2 and third data line 131-3 have the same length, so as to ensure that the environment where each of the column fingerprint pixel units 111 is located is consistent.

In the embodiments of the disclosure, still referring to FIG. 3, the fingerprint detection assembly 100 further includes an analog-to-digital conversion module 180. The analog-to-digital conversion module 180 is connected to the signal reading device 120 and is configured to convert fingerprint signals into digital signals and transmit the digital signals to a control module of an electronic apparatus, such as a Central Processing Unit (CPU), so as to facilitate the electronic apparatus to detect fingerprints.

Since the method embodiments basically correspond to the device embodiments, the related portions may refer to the description of the device embodiments. The method embodiments and the device embodiments are complementary to each other.

The above embodiments of the disclosure may complement each other without causing conflicts.

The above descriptions are only the preferred embodiments of the disclosure and are not intended to limit the disclosure. Any modifications, equivalent replacements, improvements and the like made within the spirit and principle of the disclosure should fall within the scope of protection of the disclosure.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms, and these phrases may be interchangeably used.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In some embodiments, the control and/or interface software or app can be provided in a form of a non-transitory computer-readable storage medium having instructions stored thereon is further provided. For example, the non-transitory computer-readable storage medium can be a ROM, a CD-ROM, a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more portions of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium can be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, app, script, or code) can be written in any form of programming language, including compiled or interpreted languages, declarative or procedural languages, and it can be deployed in any form, including as a stand-alone program or as a portion, component, subroutine, object, or other portion suitable for use in a computing environment. A computer program can, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more portions, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure.

That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "I" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. A fingerprint detection assembly, comprising:
a plurality of fingerprint pixel circuits; and
a signal reading device; wherein the plurality of fingerprint pixel circuits are arranged in multiple rows and multiple columns;
each column of fingerprint pixel circuits are divided into a plurality of column fingerprint pixel units along a longitudinal direction;
each of the plurality of column fingerprint pixel units is connected to the signal reading device through a respective data line, such that each of the plurality of column fingerprint pixel units has its own data line, separate from other of the plurality of column fingerprint pixel units, and each column of fingerprint pixel circuits are connected to the signal reading device through a plurality of data lines; and
the signal reading device is configured to read fingerprint signals collected by the fingerprint pixel circuits;
wherein the fingerprint pixel circuit comprises fingerprint sensing units and wires connected in the fingerprint pixel circuits, and wherein the fingerprint sensing units are disposed at a layer that is different from a layer at which the wires are disposed, and the wires comprise data lines;
wherein numbers of the wires corresponding to different column fingerprint pixel units are same, and lengths of the wires corresponding to different column fingerprint pixel units are same;
wherein the fingerprint detection assembly further comprises a switch device, and the switch device is connected between the signal reading device and the column fingerprint pixel units;
wherein the multiple columns of fingerprint pixel circuits are divided into multiple groups of column fingerprint pixel regions along a longitudinal direction, and each group of column fingerprint pixel region comprises at least two columns of fingerprint pixel circuits; and
wherein the switch device comprises a plurality of switch units, and each switch unit is connected between one group of the multiple groups of column fingerprint pixel regions and the signal reading device.

2. The fingerprint detection assembly of claim 1, wherein at least two switch units are connected to the signal reading device through a same first common wires.

3. The fingerprint detection assembly of claim 1, wherein the fingerprint detection assembly further comprises: a signal driving device which is connected to each row of fingerprint pixel circuits and configured to send a driving signal to each row of fingerprint pixel circuits; and
wherein the multiple rows of fingerprint pixel circuits are divided into multiple groups of row fingerprint pixel regions along a horizontal direction, each group of row fingerprint pixel region comprises a plurality of column fingerprint pixel units, and the plurality of column fingerprint pixel units are respectively located in different columns.

4. The fingerprint detection assembly of claim 3, wherein at least two groups of row fingerprint pixel regions are connected to the signal driving device through a same second common wires.

5. The fingerprint detection assembly of claim 1, wherein a fingerprint pixel circuit comprises a passive fingerprint pixel circuit.

6. An electronic apparatus having a display screen with a full-screen fingerprint detection capability, comprising the fingerprint detection assembly of claim 1, wherein
each of the plurality of column fingerprint pixel units is connected to the signal reading device through the respective data line, such that each column of fingerprint pixel circuits are connected to the signal reading device through a plurality of data lines, compared to an entire column of fingerprint pixel circuits being connected to a single data line, thereby reducing noise output by the signal reading device and improving accuracy for reading the fingerprint signals, and facilitating increasing size of the fingerprint detection assembly to realize the full-screen fingerprint detection capability.

7. A display panel, comprising a fingerprint detection assembly including:
a plurality of fingerprint pixel circuits; and
a signal reading device; wherein the plurality of fingerprint pixel circuits are arranged in multiple rows and multiple columns;
each column of fingerprint pixel circuits are divided into a plurality of column fingerprint pixel units along a longitudinal direction;
each of the plurality of column fingerprint pixel units is connected to the signal reading device through a respective data line, such that each of the plurality of column fingerprint pixel units has its own data line, separate from other of the plurality of column fingerprint pixel units, and each column of fingerprint pixel circuits are connected to the signal reading device through a plurality of data lines; and
the signal reading device is configured to read fingerprint signals which are collected by the fingerprint pixel circuits;
wherein the fingerprint pixel circuit comprises fingerprint sensing units and wires connected in the fingerprint pixel circuits, and wherein the fingerprint sensing units are disposed at a layer that is different from a layer at which the wires are disposed, and the wires comprise data lines;
wherein numbers of the wires corresponding to different column fingerprint pixel units are same, and lengths of the wires corresponding to different column fingerprint pixel units are same;
wherein the fingerprint detection assembly further comprises a switch device, and the switch device is connected between the signal reading device and the column fingerprint pixel units;
wherein the multiple columns of fingerprint pixel circuits are divided into multiple groups of column fingerprint pixel regions along a longitudinal direction, and each group of column fingerprint pixel region comprises at least two columns of fingerprint pixel circuits; and
wherein the switch device comprises a plurality of switch units, and each switch unit is connected between one group of the multiple groups of column fingerprint pixel regions and the signal reading device.

8. The display panel of claim 7, wherein at least two switch units are connected to the signal reading device through a same first common wires.

9. The display panel of claim 7, wherein the fingerprint detection assembly further comprises: a signal driving device which is connected to each row of fingerprint pixel circuits and configured to send a driving signal to each row of fingerprint pixel circuits; and
wherein the multiple rows of fingerprint pixel circuits are divided into multiple groups of row fingerprint pixel regions along a horizontal direction, each group of row fingerprint pixel region comprises a plurality of column fingerprint pixel units, and the plurality of column fingerprint pixel units are respectively located in different columns.

10. The display panel of claim 9, wherein at least two groups of row fingerprint pixel regions are connected to the signal driving device through a same second common wires.

11. The display panel of claim 7, wherein at least one of the plurality of fingerprint pixel circuits comprises a passive fingerprint pixel circuit.

12. The display panel of claim 7, wherein the display panel further comprises a display device, and the display device comprises a display surface; and
wherein the fingerprint detection assembly is disposed on a side of the display device facing away from the display surface, and an orthographic projection of the fingerprint detection assembly on the display surface entirely covers the display surface.

* * * * *